(12) United States Patent
Nakamura

(10) Patent No.: US 9,008,140 B2
(45) Date of Patent: Apr. 14, 2015

(54) SEMICONDUCTOR LASER

(71) Applicant: Naoki Nakamura, Tokyo (JP)

(72) Inventor: Naoki Nakamura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 112 days.

(21) Appl. No.: 13/798,376

(22) Filed: Mar. 13, 2013

(65) Prior Publication Data

US 2013/0336350 A1     Dec. 19, 2013

(30) Foreign Application Priority Data

Jun. 15, 2012  (JP) ................................. 2012-136130

(51) Int. Cl.
| | |
|---|---|
| *H01S 5/00* | (2006.01) |
| *H01S 5/323* | (2006.01) |
| *H01L 33/30* | (2010.01) |
| *H01S 5/22* | (2006.01) |
| *H01S 5/227* | (2006.01) |

(52) U.S. Cl.
CPC ............ *H01S 5/323* (2013.01); *H01L 33/30* (2013.01); *H01S 5/2226* (2013.01); *H01S 5/2275* (2013.01); *H01S 5/3235* (2013.01)

(58) Field of Classification Search
CPC ..... H01S 5/323; H01S 5/2275; H01S 5/2226; H01S 5/3235; H01L 33/30
USPC .................. 372/43.01, 45.01, 46.01
See application file for complete search history.

(56) References Cited

U.S. PATENT DOCUMENTS

| 5,148,439 A | 9/1992 | Wünstel et al. | |
|---|---|---|---|
| 5,556,804 A * | 9/1996 | Nagai ............................. | 438/5 |
| 2011/0158279 A1* | 6/2011 | Sakaino ..................... | 372/46.01 |

FOREIGN PATENT DOCUMENTS

| JP | 3-97290 A | 4/1991 |
|---|---|---|
| JP | 2000-353849 A | 12/2000 |

* cited by examiner

*Primary Examiner* — Yuanda Zhang
(74) *Attorney, Agent, or Firm* — Leydig, Voit & Mayer, Ltd.

(57) ABSTRACT

A semiconductor laser includes: a p-type semiconductor substrate; a ridge having an active layer and cladding layers on the semiconductor substrate; a current blocking layer embedding side surfaces of the ridge; and an n-type contact layer on the ridge and the current blocking layer. The current blocking layer includes a first p-type layer, an n-type layer or a hole-trapping insulating semiconductor layer, a second p-type layer, a diffusion inhibiting layer, and a third p-type layer stacked, in order, from the semiconductor substrate. The n-type contact layer includes a p-type inverted region located in a portion of the n-type contact layer, in contact with the third p-type layer. Dopants in the third p-type layer diffuse into the p-type inverted region. The diffusion inhibiting layer is an undoped semiconductor material or a semi-insulating semiconductor material and inhibits dopants in the third p-type layer from being diffused into the active layer.

3 Claims, 4 Drawing Sheets

SEMICONDUCTOR LASER

BACKGROUND OF THE INVENTION

1. Field of the Invention

The present invention relates to an embedment-type semiconductor laser having both side surfaces of a ridge embedded in a current blocking layer and method for manufacturing the same

2. Background Art

Embedment-type semiconductor lasers having both side surfaces of a ridge embedded in a current blocking layer are being widely used (see, for example, Japanese Patent Laid-Open No. 3-97290). FIG. 5 is a sectional view of a conventional semiconductor laser. A ridge 5 having an active layer 2 and a p-type InP clad layer 3 and an n-type InP clad layer 4 disposed on opposite sides of the active layer 2 is provided on a p-type InP substrate 1. Two side surfaces of the ridge 5 are embedded in a current blocking layer 6. An n-type InP contact layer 7 is provided on the ridge 5 and the current blocking layer 6. The current blocking layer 6 includes a p-type InP layer 8, an n-type InP layer 9 and a p-type InP layer 10 stacked in order from the p-type InP substrate 1 side.

A distance L is the shortest distance between the n-type InP layer 9 in the current blocking layer 6 and the n-type InP contact layer 7. The distance L is determined by the layer thickness of the p-type InP layer 10. The distance L first determined and the distance L after the completion of the wafer process are substantially equal to each other. If the distance L is small, electrons in the n-type InP contact layer 7 can overflow into the p-type InP layer 10 and flow into the n-type InP layer 9. Since these electrons are not injected into the active layer 2, they flow as a leak current, so that the optical output is reduced. When the semiconductor laser is operated by causing a large current to flow therethrough, the overflow of electrons is increased. In such a case, therefore, the problem becomes more serious.

FIG. 6 is a diagram showing current-optical output characteristics of the conventional semiconductor laser. A simulation was made by maintaining the ambient temperature at 95 degrees C. with respect to different values of the distance L of 100 nm, 250 nm, and 300 nm. The results of this simulation show that the optical output is reduced when the distance L is smaller than 300 nm.

SUMMARY OF THE INVENTION

FIGS. 7 and 8 are sectional views showing a process for manufacturing the conventional semiconductor laser. Referring to FIG. 7, the ridge 5 is formed by dry etching. A mask 14 used for etching is also used for selectively growing the current blocking layer 6. If the thickness of the p-type InP layer 10 is increased in order to set the distance L to a large value, the p-type InP layer 10 projects largely by the side of the mask 14. Therefore, when the n-type InP contact layer 7 is grown after removing the mask 14, the surface of the n-type InP contact layer 7 has projections and recesses, such that a fault occurs, for example, pattern abnormally in a photolithography process step in a subsequent process.

In FIG. 8, the ridge 5 is formed by wet etching. In this case, the mask 14 projects largely from the ridge 5. Since material gas does not flow suitably into spaces right below the projecting portions of the mask 14, the growing rate of the current blocking layer 6 decreases. The p-type InP layer 10 cannot therefore be grown to have a sufficiently large thickness below the projecting portions. The thickness corresponding to the distance L is ordinarily about 100 to 200 nm. It is difficult to increase this thickness to 300 nm or more.

In view of the above-described problems, an object of the present invention is to provide a semiconductor laser and method for manufacturing the same which can prevent the formation of a projection/recess in the crystal surface and deterioration of the laser characteristic.

According to the present invention, a semiconductor laser includes: a p-type semiconductor substrate; a ridge having an active layer and clad layers on the semiconductor substrate; a current blocking layer embedding side surfaces of the ridge; and an n-type contact layer on the ridge and the current blocking layer. The current blocking layer includes a first p-type layer, an n-type layer or a hole-trap-type semi-insulating semiconductor layer, a second p-type layer, a diffusion inhibiting layer, and a third p-type layer stacked in order from the semiconductor substrate side. The n-type contact layer includes a p-type inverted region provided in a portion of the n-type contact layer in contact with the third p-type layer. Dopants in the third p-type layer are diffused in the p-type inverted region. The diffusion inhibiting layer is an undoped semiconductor material or a semi-insulating semiconductor material and inhibits dopants in the third p-type layer from being diffused into the active layer.

The present invention makes it possible to prevent the formation of a projection/recess in the crystal surface and deterioration of the laser characteristic.

Other and further objects, features and advantages of the invention will appear more fully from the following description.

DETAILED DESCRIPTION OF THE PREFERRED EMBODIMENTS

A semiconductor laser and method for manufacturing the same according to the embodiments of the present invention will be described with reference to the drawings. The same components will be denoted by the same symbols, and the repeated description thereof may be omitted.

First Embodiment

Figure 1:
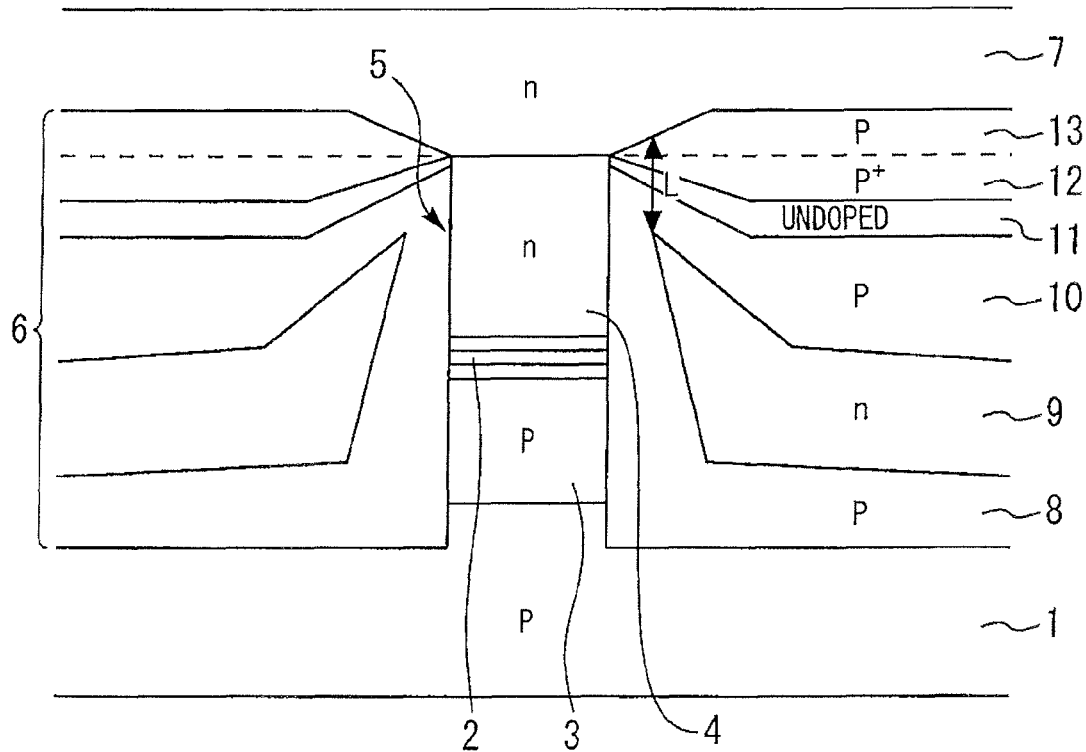
FIG. 1 is a sectional view of a semiconductor laser according to a first embodiment of the present invention.

FIG. 1 is a sectional view of a semiconductor laser according to a first embodiment of the present invention. A ridge 5 having an active layer 2 and a p-type InP clad layer 3 and an n-type InP clad layer 4 disposed on opposite sides of the active layer 2 is provided on a p-type InP substrate 1. Two side surfaces of the ridge 5 are embedded in a current blocking layer 6. An n-type InP contact layer 7 is provided on the ridge 5 and the current blocking layer 6.

The current blocking layer 6 includes a p-type InP layer 8, an n-type InP layer 9, a p-type InP layer 10, an undoped InP layer 11 and highly doped p-type InP layer 12 stacked in order from the p-type InP substrate 1 side. These layers and the n-type InP contact layer 7 constitute a p-n-p-n thyristor structure.

The n-type InP contact layer 7 has a p-type inverted region 13 in which a dopant in the highly doped p-type InP layer 12 is diffused in its portion in contact with the highly doped p-type InP layer 12. The undoped InP layer 11 inhibits the dopant in the highly doped p-type InP layer 12 from being diffused into the active layer 2.

Figure 2:
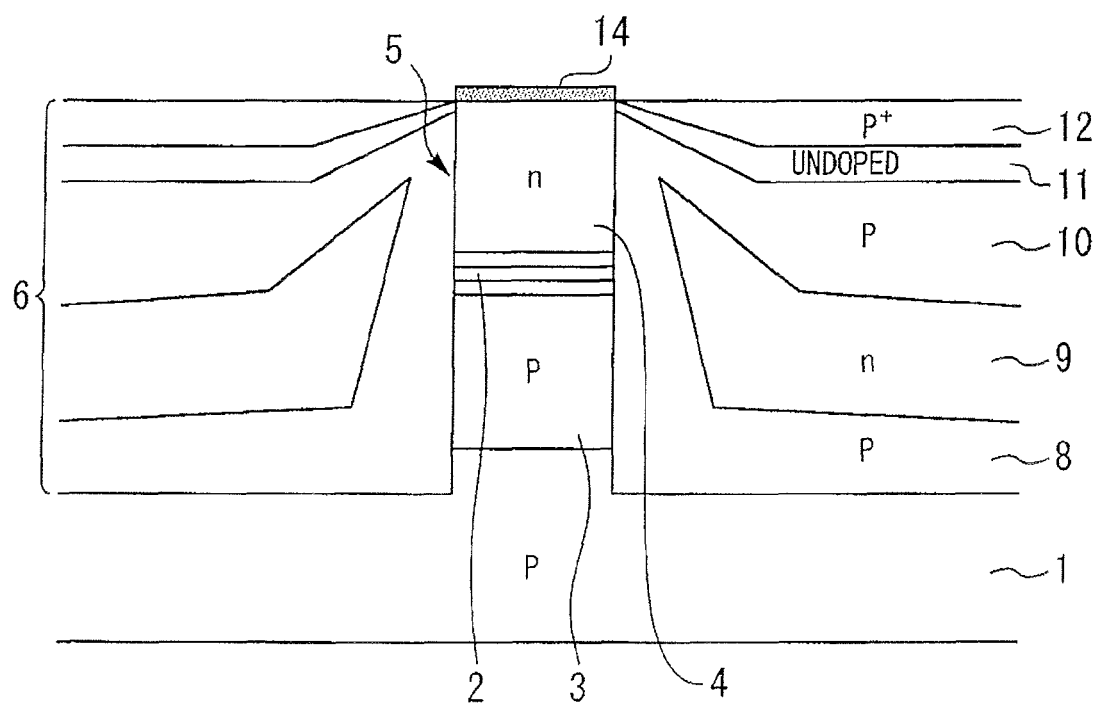
FIG. 2 is a sectional view showing a process for manufacturing the semiconductor laser according to the first embodiment of the present invention.

A method of manufacturing the semiconductor laser according to the present embodiment will be described. FIG. 2 is a sectional view showing a process for manufacturing the semiconductor laser according to the first embodiment of the present invention. The p-type InP clad layer 3, the active layer 2 and the n-type InP clad layer 4 are first epitaxially grown successively on the p-type InP substrate 1 by metal organic chemical vapor deposition (MOCVD), followed by dry etching using the mask 14. The ridge 5 is formed thereby. As a method for etching, wet etching may alternatively be used.

Next, the side surfaces of the ridge 5 and the p-type InP substrate 1 are covered with the p-type InP layer 8, and the n-type InP layer 9, the p-type InP layer 10, the undoped InP layer 11 and the highly doped p-type InP layer 12 are stacked thereon. The two side surfaces of the ridge 5 are embedded in the current blocking layer 6 formed of these layers.

The highly doped p-type InP layer 12 has an impurity concentration higher than that in the p-type InP layer 10. As a dopant in the highly doped InP layer 12, a dopant such as Zn having a high diffusion coefficient is used. It is not necessarily required that the rate of activation of the dopant in the highly doped p-type InP layer 12 be close to 100% immediately after the growth of the current blocking layer 6. Part of the dopant may be inactive.

Next, the n-type InP contact layer 7 is formed on the ridge 5 and the current blocking layer 6. The p-type inverted region 13 is formed in the portion of the n-type InP contact layer 7 in contact with the highly doped p-type InP layer 12 by successively performing annealing in the MOCVD unit after the growth of the n-type InP contact layer 7 so that the dopant in the highly doped p-type InP layer 12 is diffused in the p-type inverted region 13. The place for annealing is not limited to the interior of the MOCVD unit. Annealing may performed in an annealing furnace. Any other means for annealing may be used if the corresponding high temperature can be reached.

Figure 6:
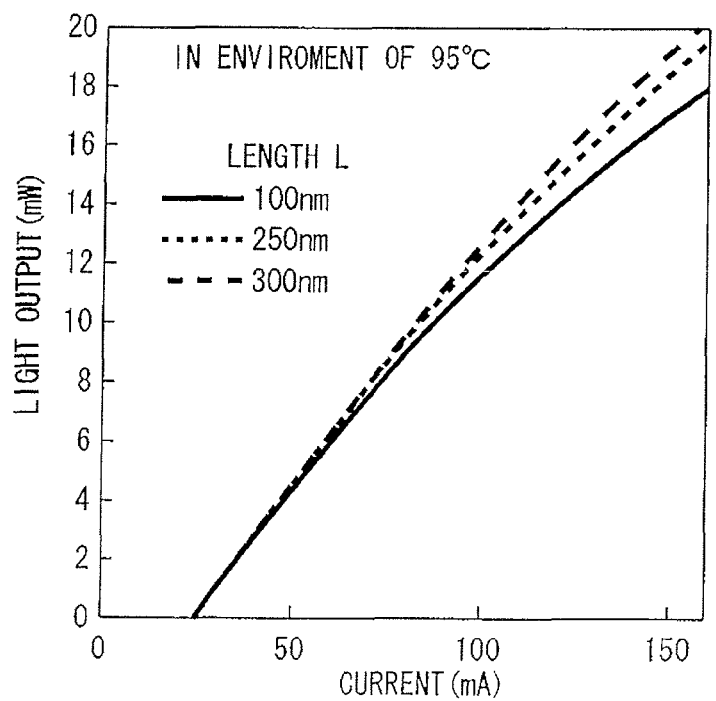
FIG. 6 is a diagram showing current-optical output characteristics of the conventional semiconductor laser.
Figure 7:
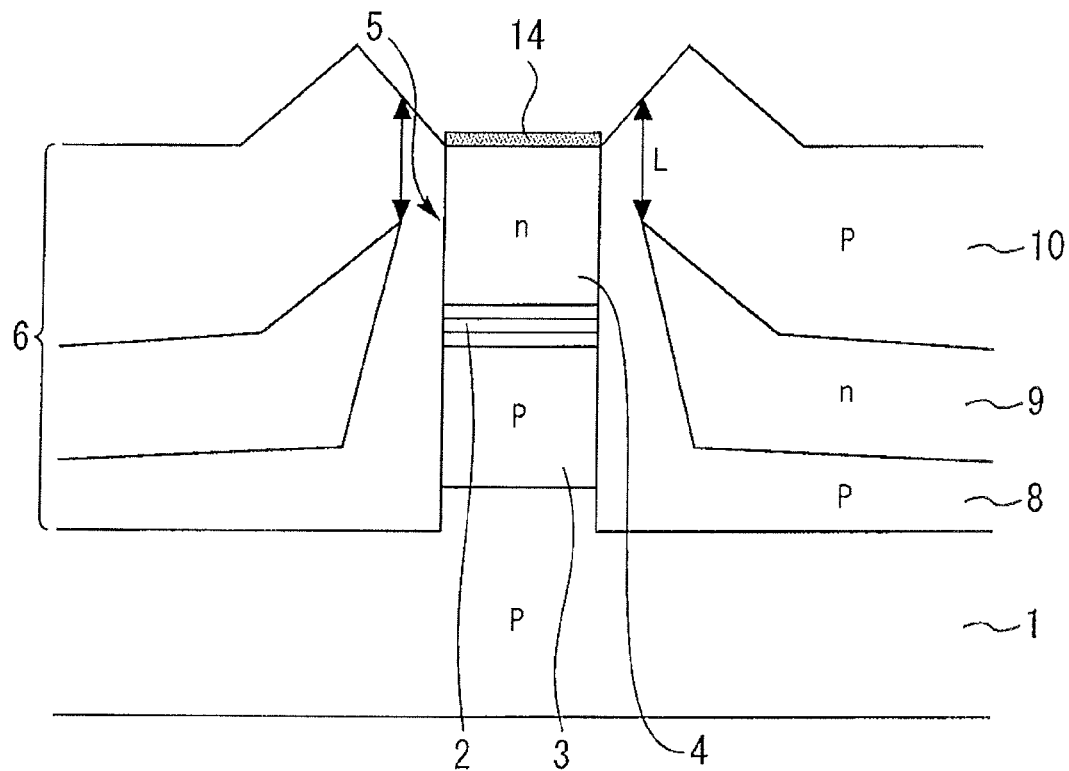
FIGS. 7 and 8 are sectional views showing a process for manufacturing the conventional semiconductor laser.
Figure 8:
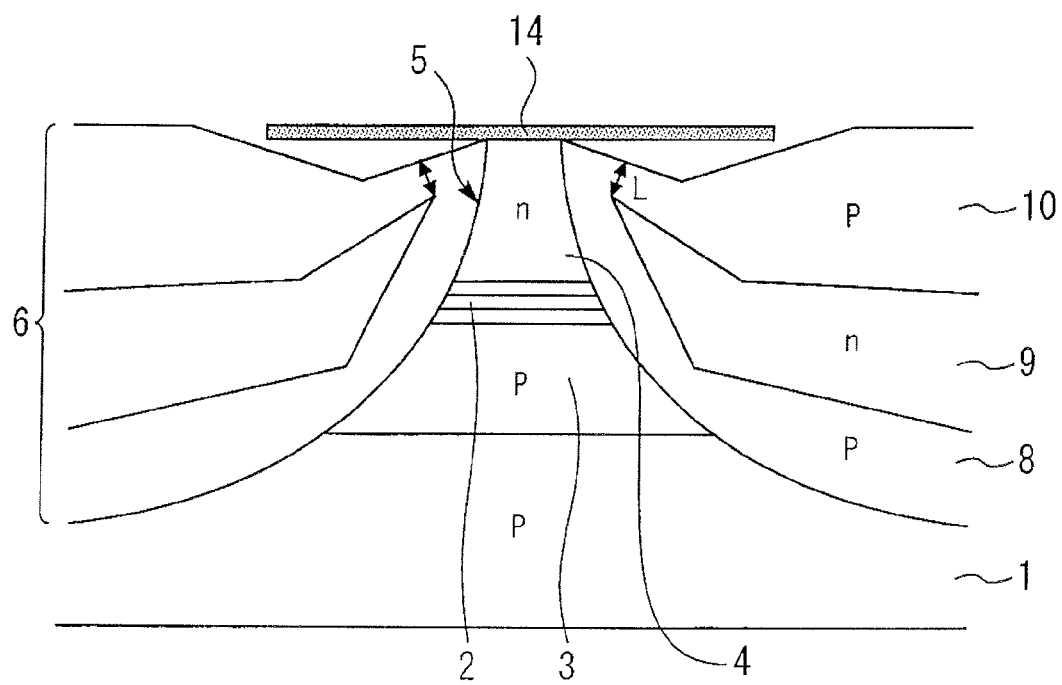

The effects of the present embodiment will be described. The dopant in the highly doped p-type InP layer 12 is diffused into the n-type InP contact layer 7 to form the p-type inverted region 13, thereby enabling to increase the distance L. If the distance L equal to or larger than 300 nm is secured, the leak current between the current blocking layer 6 and the n-type InP contact layer 7 in the thyristor structure can be limited to prevent a reduction in optical output such as shown in FIG. 6. Also, it is not necessary to increase the thickness of the p-type InP layer 10 in order to set the distance L to a large value. Therefore the formation of a projection/recess in the crystal surface can be prevented.

Since the dopant in the highly doped p-type InP layer 12 is isotropically diffused, it is also diffused on the active layer 2 side. If the dopant is diffused in the vicinity of the active layer 2, the hole concentration is increased and absorption of light by inter-valence-band absorption or the like is caused, resulting in degradation of a laser characteristic. Therefore the undoped InP layer 11 is provided right below the highly doped p-type InP layer 12. The diffused dopant is consumed for change of the undoped InP layer 11 into the p-type (the dopant concentration gradient is compensated), thereby inhibiting the dopant from being diffused into the active layer 2. Therefore, deterioration of the laser characteristic can be prevented.

It is desirable that the undoped InP layer 11 is an intrinsic semiconductor. However, an effect equivalent to that obtained with an intrinsic semiconductor can be obtained even with an n-type semiconductor having an impurity concentration of about $1 \times 10^{16}$ cm$^{-3}$ by optimizing the layer thickness. In a case where the undoped InP layer 11 is a p-type semiconductor having an impurity concentration of about $1 \times 10^{16}$ cm$^{-3}$, however, the diffusion inhibition effect is reduced because the p-type semiconductor has a smaller concentration gradient to the highly doped p-type InP layer 12 in comparison with the n-type semiconductor. It is, therefore, desirable that the undoped InP layer 11 be an intrinsic semiconductor or an n-type semiconductor having an extremely low impurity concentration.

The extent of diffusion of the dopant in the highly doped p-type InP layer 12 varies depending on the amount of doping of the highly doped p-type InP layer 12 and annealing conditions. There is, therefore, a need to experimentally find optimal conditions with respect to the extent of diffusion of the dopant. There is a need to experimentally find the optimum value of the layer thickness of the undoped InP layer 11 according to the amount of doping of the highly doped p-type InP layer 12 and the annealing conditions.

Second Embodiment

Figure 3:
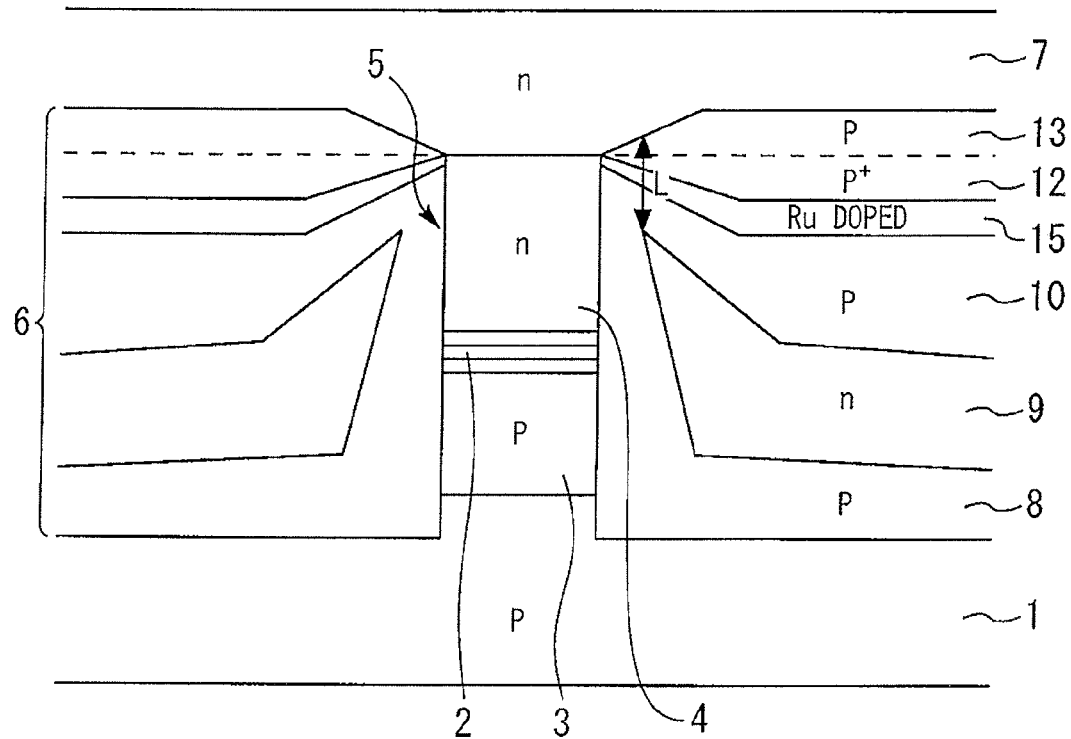
FIG. 3 is a sectional view of a semiconductor laser according to a second embodiment of the present invention.

FIG. 3 is a sectional view of a semiconductor laser according to a second embodiment of the present invention. In the second embodiment, a Ru-doped InP layer 15, which is a semi-insulating semiconductor, is provided in place of the undoped InP layer 11 of the first embodiment. In other respects, the construction is the same as that of the first embodiment.

Ru, which is the dopant in the Ru-doped InP layer 15, does not diffuse by interdiffusion with Zn, which is the dopant in the highly doped p-type InP layer 12. Therefore, diffusion into the active layer 2 of the dopant in the highly doped p-type InP layer 12 can be inhibited. As a result, deterioration of the laser characteristic can be prevented. The Ru-doped InP layer 15 is not exclusively used. Any other material may alternatively be used if it has a dopant that does not diffuse by interdiffusion with the dopant in the highly doped p-type InP layer 12.

Third Embodiment

Figure 4:
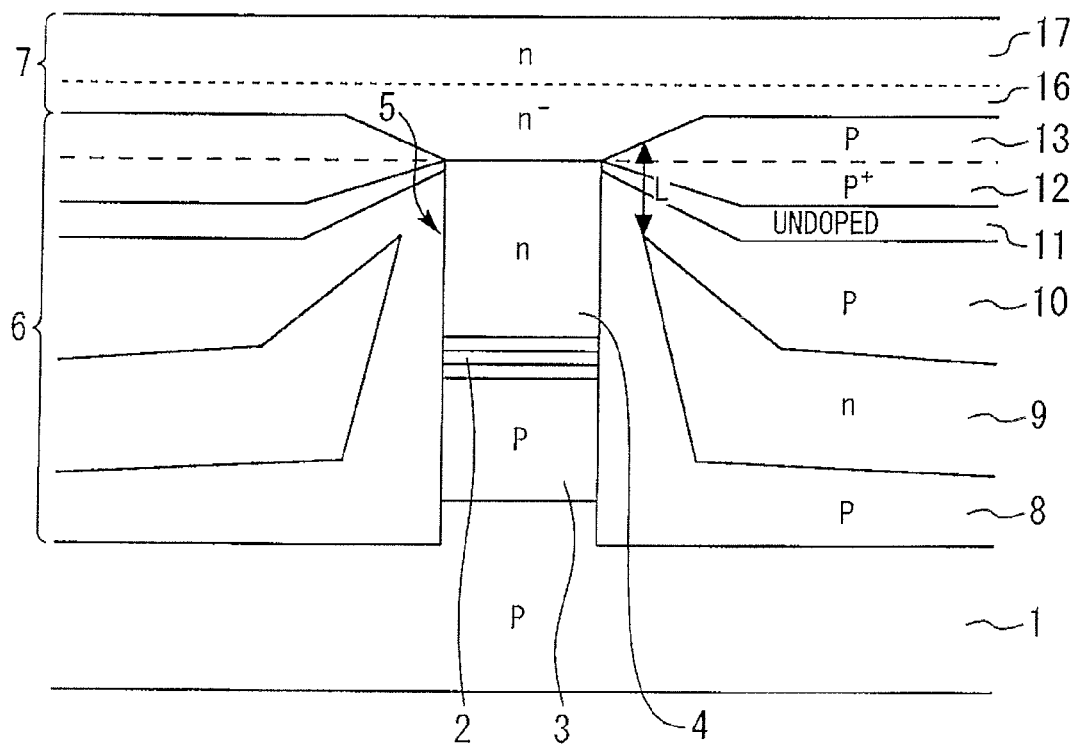
FIG. 4 is a sectional view of a semiconductor laser according to a third embodiment of the present invention.
Figure 5:
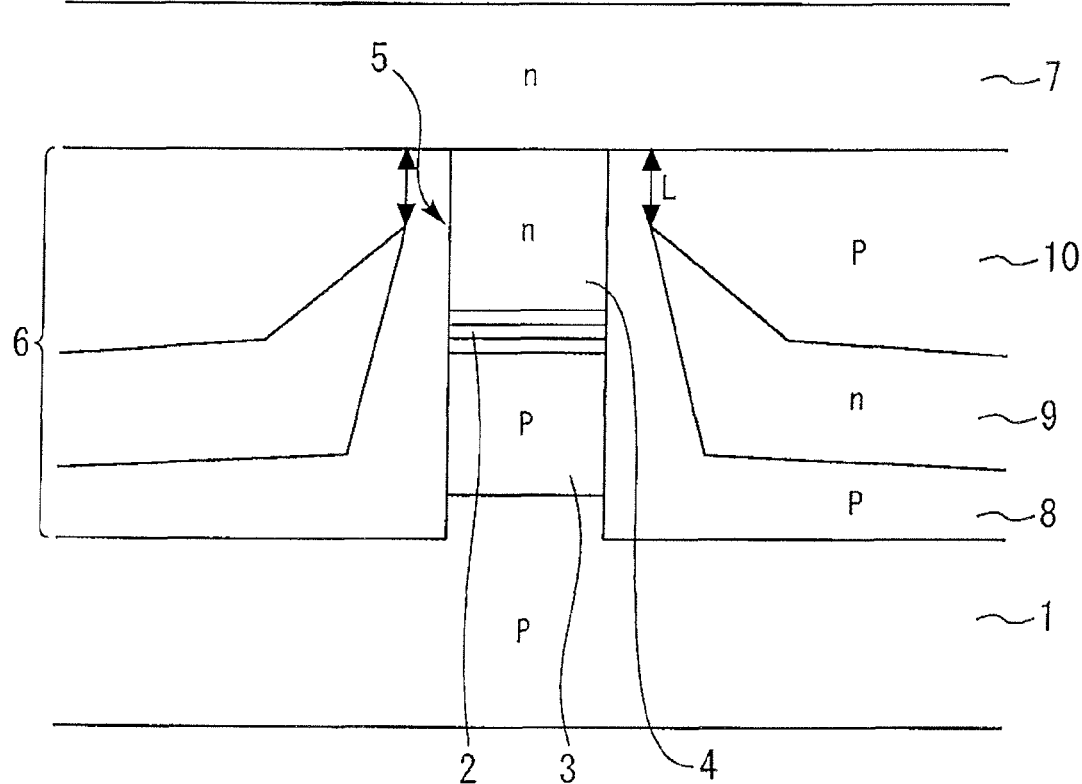
FIG. 5 is a sectional view of a conventional semiconductor laser.

FIG. 4 is a sectional view of a semiconductor laser according to a third embodiment of the present invention. An n-type InP contact layer 7 includes an n-type InP contact layer 16 and an n-type InP contact layer 17 provided on the n-type InP contact layer 16. The n-type InP contact layer 17 has an impurity concentration higher than that in the n-type InP contact layer 16. The n-type InP contact layer 16 has a p-type inverted region 13 provided in its portion in contact with a highly doped p-type InP layer 12. In other respects, the construction is the same as that of the first embodiment.

The impurity concentration in the n-type InP contact layer 16 forming the first layer in the n-type InP contact layer 7 is set to a lower value to increase the diffusion of the dopant from the highly doped p-type InP layer 12, thereby enabling to increase the distance L.

The layer thickness of the n-type InP contact layer 16 and the impurity concentration in this layer are adjusted so that the distance L equal to or larger than 300 nm can be secured. Although the n-type InP contact layer 16 having a lower impurity concentration is inserted right above the n-type InP clad layer 4 in the ridge 5, substantially no increase in resistance value results because the carrier for the current in this place is electrons.

Fourth Embodiment

In a fourth embodiment, the n-type InP layer 9 in the semiconductor lasers shown in FIGS. 1, 2, 3, and 4 is replaced with Ru-doped InP. Ru-doped InP is a material having a high hole trap density and a low electron trap density. Therefore, inflow of electron current into a Ru-doped InP layer occurs as a leak current to cause deterioration of the laser characteristic. In the present embodiment, however, overflow of electrons is inhibited by the p-type blocking layer with an increased thickness (the highly doped p-type InP layer 12 and the p-type inverted region 13). Therefore, an electron leak to the Ru-doped InP layer 9 can be inhibited and deterioration of the laser characteristic can be prevented. The Ru-doped InP layer 9 is not exclusively used. The same effect can be obtained by using a material having an electron trap density lower than its hole trap density or a semi-insulating semiconductor material (referred to as a hole-trap-type semi-insulating semiconductor in the present application) having no electron trap level.

In a case where an n-type substrate is used while a p-type substrate is used in the first to fourth embodiments, it is necessary to highly dope the p-type InP layer in the current blocking layer 6 covering the side surfaces of the ridge 5. In this case, since the layer in contact with the active layer 2 is highly doped, diffusion of the dopant into the active layer 2 occurs to cause degradation of the laser characteristic. For this reason, an n-type substrate is not suitable for use in the laser of the present invention. Each of the first to third embodiments can be applied not only to a single semiconductor laser but also to a semiconductor laser having an embedding structure such as an embedment-type semiconductor laser with an external modulator.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-136130, filed on Jun. 15, 2012, including specification, claims, drawings, and summary, on which the Convention priority of the present application is based, is incorporated herein by reference in its entirety.

What is claimed is:

1. A semiconductor laser comprising:
   a p-type semiconductor substrate;
   a ridge having an active layer and cladding layers on the semiconductor substrate, the cladding layers being disposed on opposite sides of the active layer;
   a current blocking layer embedding side surfaces of the ridge; and
   an n-type contact layer on the ridge and the current blocking layer, wherein
      the current blocking layer includes a first p-type layer, an n-type layer or hole-trapping semi-insulating semiconductor layer, a second p-type layer, a diffusion inhibiting layer, and a third p-type layer stacked, in order, from the semiconductor substrate,
      the n-type contact layer includes a p-type inverted region located in a portion of the n-type contact layer, in contact with the third p-type layer,
      dopants from the third p-type layer have diffused into the p-type inverted region, and
      the diffusion inhibiting layer is an undoped semiconductor material or a semi-insulating semiconductor material and inhibits dopants in the third p-type layer from diffusing into the active layer.

2. The semiconductor laser according to claim 1, wherein dopants in the semi-insulating semiconductor material do not diffuse by interdiffusion with dopants in the third p-type layer.

3. The semiconductor laser according to claim 1, wherein the n-type contact layer includes a first contact layer and a second contact layer on the first contact layer,
   the second contact layer has an impurity concentration higher tha impurity concentration in the first contact layer, and
   the p-type inverted region is located in a portion of the first contact layer, in contact with the third p-type layer.

* * * * *